(12) United States Patent
Peeters et al.

(10) Patent No.: US 6,393,592 B1
(45) Date of Patent: May 21, 2002

(54) SCAN FLOP CIRCUITRY AND METHODS FOR MAKING THE SAME

(75) Inventors: David A. Peeters, Cerritos; Kewi-Yao Peng, Anaheim, both of CA (US)

(73) Assignee: Adaptec, Inc., Milpitas, CA (US)

( * ) Notice: Subject to any disclaimer, the term of this patent is extended or adjusted under 35 U.S.C. 154(b) by 0 days.

(21) Appl. No.: 09/316,492

(22) Filed: May 21, 1999

(51) Int. Cl.$^7$ .............................................. G01R 31/28
(52) U.S. Cl. ...................... 714/731; 714/727; 714/729
(58) Field of Search .................. 714/726, 727, 714/729, 731

(56) References Cited

U.S. PATENT DOCUMENTS

| | | | | |
|---|---|---|---|---|
| 4,580,137 A | * | 4/1986 | Fiedler et al. | 340/825.68 |
| 4,947,395 A | * | 8/1990 | Bullinger et al. | 714/730 |
| 5,390,190 A | * | 2/1995 | Nanda et al. | 714/727 |
| 5,574,731 A | * | 11/1996 | Qureshi | 714/726 |
| 5,592,493 A | * | 1/1997 | Crouch et al. | 714/729 |
| 5,774,003 A | * | 6/1998 | Qureshi et al. | 327/202 |
| 5,790,439 A | * | 8/1998 | Yamanaka et al. | 708/316 |
| 5,909,451 A | * | 6/1999 | Lach et al. | 714/726 |
| 6,182,256 B1 | * | 1/2001 | Qureshi | 714/726 |

* cited by examiner

*Primary Examiner*—Albert Decady
*Assistant Examiner*—Joseph Torres
(74) *Attorney, Agent, or Firm*—Martine & Penilla, LLP

(57) ABSTRACT

A scan flop cell and method for making the scan flop cell are provided. The scan flop cell includes a D flip-flop, a scan multiplexer, and a clock multiplexer. The clock multiplexer is configured to receive a functional clock and a scan clock. A scan mode terminal SM is connected to the scan multiplexer to control the clock output of the clock multiplexer. The scan flop cell also preferably includes a data terminal D, a scan input terminal SI, a scan enable terminal SE, a functional clock terminal C, a scan clock terminal SC, and the scan mode terminal SM. Still further, the scan flop cell can be integrated with asynchronous set and/or reset blocking circuitry, which internally converts the asynchronous set and/or reset into synchronous set and/or reset signals.

21 Claims, 6 Drawing Sheets

SCAN FLOP CIRCUITRY AND METHODS FOR MAKING THE SAME

BACKGROUND OF THE INVENTION

1. Field of the Invention

This invention relates generally to integrated circuits (ICs) and more particularly concerns integrated scan flop cells that can be used to facilitate scan testing of integrated circuit designs.

2. Description of the Related Art

In an effort to remain competitive in the marketplace, chip manufacturers are constantly striving to optimize the design and efficiency of their ICs by increasing chip speed, quality and the density of internal circuit components. Commensurate with meeting these objectives is to maximize fault coverage when testing their IC designs. A common industry design practice is to make the IC design scannable by implementing scan cells. Among many types of scan cells, the most common one is the so called "muxed-scan," or also referred to herein as a "scan flop." FIG. 1A illustrates a conventional scan flop 100 having a multiplexer 102 and a D flip flop 104. Generally, the scan flop 100 has a system data input (DI) and a scan data input (SI) that are respectively connected to the multiplexer 102. The muliplexer 102 is configured to receive a scan enable (SE) and output a signal to a D input of the D flip-flop 104. The scan flop 100 also receives a clock signal (CP) which is communicated to the D flip-flop 104, and output pins Q and NQ that are also selectively output from the D flip-flop 104. The scan flop is therefore configured to operate in one of two modes. The first mode is a "system" mode (also known as the functional mode), and the second mode is a "scan" mode (also known as the test mode).

Figure 1B illustrates a simplified semiconductor chip 101 having a scan chain that is made up of a plurality of interconnected scan flops 100. In actuality, when a full-scan design is implemented for a semiconductor chip 101, many more scan chains are integrated into the IC design to enable the scan test to achieve the highest fault coverage. However, for this simplified example, the first scan flop 100 of the scan chain has its scan data input (SI) connected to a pad 110, and a pad 112 connected to the output pin Q of the last scan flop 100. Also shown is a clock (CLK) pad connected to each of the clock signals (CP) of the individual scan flops 100. The output pins Q of each of the scan flops 100 of the scan chain are shown connected to the scan data inputs (SI). In this common scan chain design, non-scan chain logic 106 is also connected to the output pins Q and the scan data inputs (SI).

Additionally, non-scan chain logic 106 may further be connected to the output pins NQ. When the scan flop 100 is in the functional system mode, the scan enable (SE) signal is constrained to ground, such that the scan flop 100 operates identically to the D flip-flop 104. In the scan mode, the scan enable (SE) signal is active high in shifting.

To properly implement scan on a chip, the chip would have to be synchronous by design. Thus, designs that have more than one clock domain are generally difficult to test using chains of scan flops. Thus, most if not all scan flops would have to be clocked by one of the few main clock signals that run throughout the chip. Accordingly, for chips that do not meet this criteria, either by design or necessity, a regular scan approach would not be possible.

An attempt to solve this problem includes using level-sensitive scan device (LSSD) methods. LSSD was originally designed by inserting scan into latches. The edge trigger flop derived LSSD, however, still required two non-overlapping clocks. Not only does it take additional logic to generate two non-inverting clocks, it also takes up more routing area on a chip.

In addition, scan flops with asynchronous set and/or reset will also need to have these ports blocked because of their asynchronous nature. This, unfortunately, lowers the fault coverage on the nodes that control these pins. If the asynchronous set and/or reset is not blocked during scan mode operations (e.g., shifting), an asynchronous reset can inadvertently trigger a reset and clear the result that is to be shifted out. More specifically, the cloud of logic that drives the asynchronous reset (and which is not controlled by a scan pin), can cause the test pattern to be cleared. When this happens, the test tool will not be able to shift the test pattern through, and as a result the testing will not work.

In view of the foregoing, there is a need for integrated scan circuitry that can handle multiple clock domains without increasing external circuit complexity. There is also need for integrated scan circuitry that can protect scan flops from inadvertent sets and resets during scan mode testing.

SUMMARY OF THE INVENTION

Broadly speaking, the present invention fills these needs by providing scan flop circuitry for handling multiple clock domains. The scan flop circuitry of the present invention can also be integrated with logic that internally converts asynchronous set/reset conditions into synchronous set/reset conditions during scan mode operations. It should be appreciated that the present invention can be implemented in numerous ways, including as a process, an apparatus, a system, a device, or a method. Several inventive embodiments of the present invention are described below.

In one embodiment, a scan flop cell is disclosed. The scan flop cell includes a D flip-flop, a scan multiplexer, and a clock multiplexer. The clock multiplexer is configured to receive a functional clock and a scan clock, and a scan mode terminal SM controls the output of the clock multiplexer. The scan flop cell also preferably includes a data terminal D, a scan input terminal SI, a scan enable terminal SE, a functional clock terminal C, a scan clock terminal SC, and the scan mode terminal SM.

In this embodiment, the scan flop cell can also include asynchronous reset blocking circuitry. The asynchronous reset blocking circuitry includes: (a) a multiplexer that is connected to an output of the scan multiplexer and to the data terminal D, and the multiplexer has an output that connects to a data node of the D flip-flop; (b) an OR gate having an input connected to the data terminal D and another input connected to an output of an inverter; an input of the inverter is connected to an NS terminal of the scan flop cell, and an output of the OR gate that connects to the scan multiplexer; and (c) an OR gate having one input connected to the scan mode terminal and another input connected to the NS terminal, and an output of the OR gate that is coupled to a set terminal of the D flip flop.

Still in this embodiment, the scan flop can include asynchronous set blocking circuitry. The asynchronous set blocking circuitry includes: (a) a multiplexer that is connected to an output of the scan multiplexer and to the data terminal D, and the multiplexer has an output that connects to a data node of the D flip-flop; (b) an OR gate having an input connected to the data terminal D and another input connected to an output of an inverter; an input of the inverter is connected to an NS terminal of the scan flop cell, and an output of the OR gate connects to the scan multiplexer; (c)

and an OR gate having one input connected to the scan mode terminal and another input connected to the NS terminal, and an output of the OR gate is coupled to a set terminal of the D flip flop.

In another embodiment, an integrated scan flop circuit is disclosed. The integrated scan flop circuit includes a D flip-flop circuit, a scan multiplexer, another multiplexer, a clock multiplexer; an asynchronous set blocking OR gate that has an output connected to a set terminal of the D flip-flop, and an asynchronous reset blocking OR gate that has an output connected to a reset terminal of the D flip flop. In this embodiment, the scan flop can be implemented for conditions in which either the scan flop is set dominant or for conditions in which the scan flop is reset dominant.

In yet another embodiment, a method for making scan flop cell for use in scan testing an integrated circuit design is disclosed. The method includes integrating to the scan flop cell a D flip-flop circuit, a scan multiplexer; and a clock multiplexer. In one aspect of this embodiment, the method can include: (a) integrating another multiplexer to the scan flop cell; (b) integrating an asynchronous set blocking gate having an output connected to a set terminal of the D flip-flop; and (c) integrating an asynchronous reset blocking gate having an output connected to a reset terminal of the D flip flop. The asynchronous set and reset blocking gates are configured to internally convert set and reset signals into synchronous set and reset signals.

The inventive scan flop cell designs are generally integrated into IC designs in the form of scan chains. The scan chains made using the scan flops of the present invention are well suited for use in designs having multiple clock domains. In other embodiments of the present invention, the scan flops can internally convert asynchronous set and/or reset signals into synchronous set and/or reset signals, thereby eliminating inadvertent clearing of scan pattern data. Other aspects of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION OF THE PREFERRED EMBODIMENTS

An invention is described for scan flop circuitry for handling multiple clock domains. The scan flop circuitry of the present invention can also be integrated with logic that internally converts asynchronous set/reset conditions into synchronous set/reset conditions during scan mode operations. It will be obvious, however, to one skilled in the art that the present invention may be practiced without some or all of these specific details. In other instances, well known process operations have not been described in detail in order not to unnecessarily obscure the present invention.

Figure 1A:
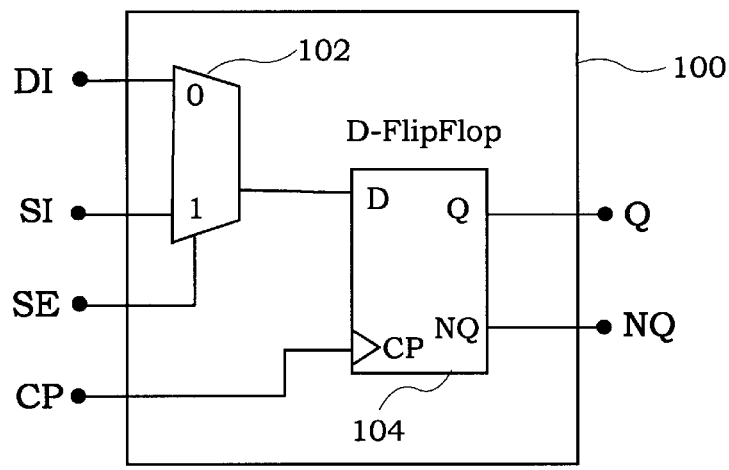
FIG. 1A illustrates a conventional scan flop having a multiplexer and a D flip flop.
Figure 1B:
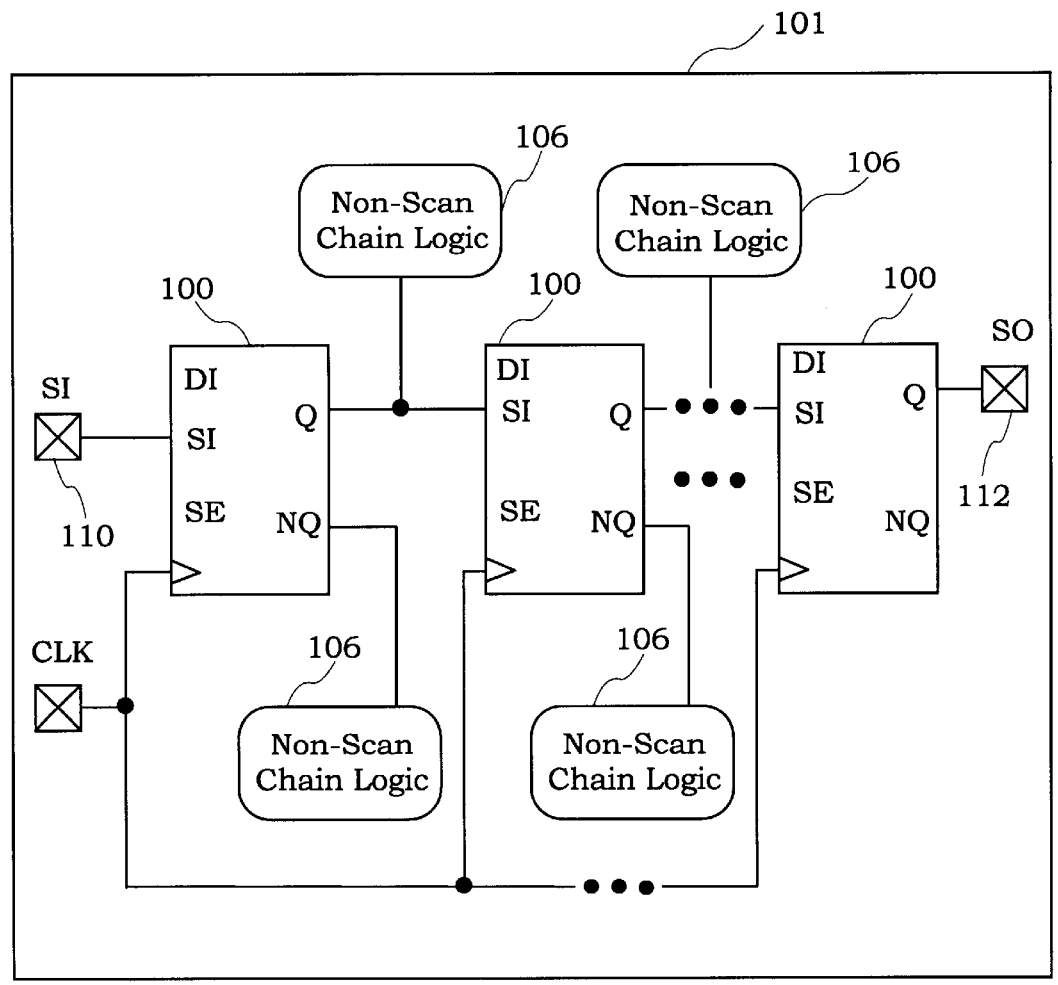
FIG. 1B illustrates a simplified semiconductor chip having a scan chain that is made up of a plurality of interconnected scan flops.
Figure 2:
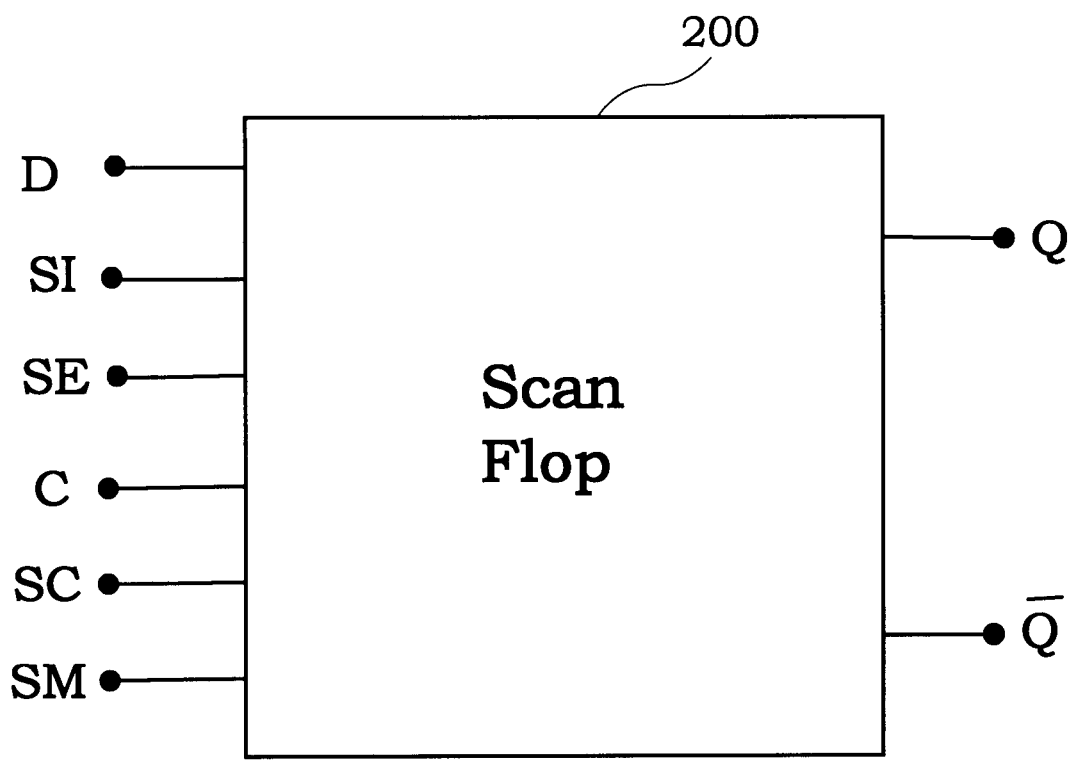
FIG. 2 illustrates a scan-flop having internally integrated circuitry and associated pins that can be used to interconnect to miscellaneous logic and other scan-flops to create scan chains, in accordance with one embodiment of the present invention.

FIG. 2 illustrates a scan-flop 200 having internally integrated circuitry and associated pins that can be used to interconnect to miscellaneous logic and other scan-flops 200 to create scan chains, in accordance with one embodiment of the present invention. As shown, the scan-flop 200 will have a data terminal D, a scan input terminal SI, a scan enable terminal SE, a clock terminal C, a scan clock terminal SC, a scan mode terminal SM, and terminals for outputs Q and/Q. By implementing internal integrated circuitry within the scan-flop 200, it is possible to route two separate clocks to the scan-flop 200. Preferably, one clock is a regular functional system clock, and the other clock is a dedicated scan clock. The scan mode SM terminal is configured to pass a logical signal that assists in selecting between either the functional system clock that is provided to the clock terminal C, or the scan clock that is provided to the scan clock terminal SC. The circuitry of the scan-flop 200 therefore avoids the need for special external logic for preventing clock skew and overlapping clocks.

Figure 3:
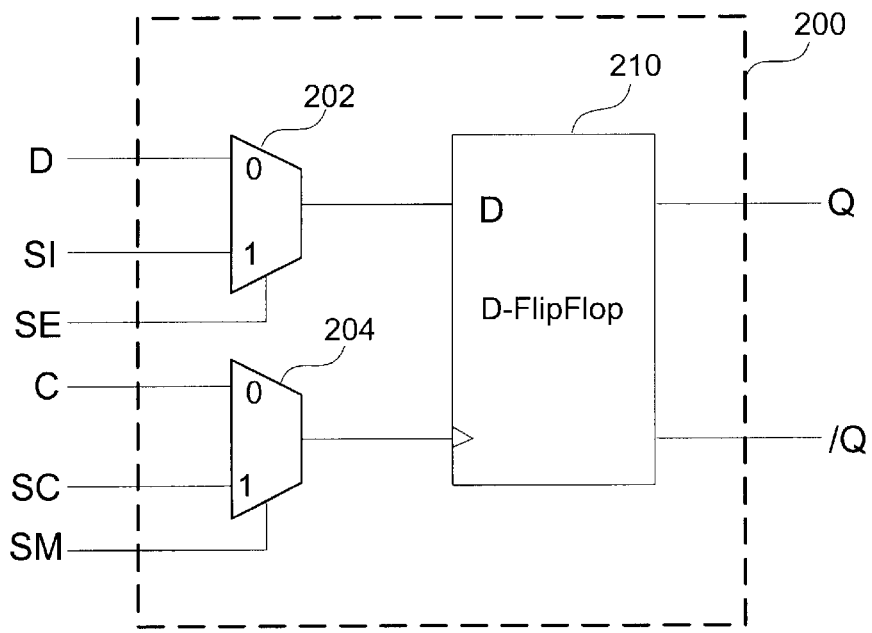
FIG. 3 illustrates a more detailed diagram of the scan flop of FIG. 2, in accordance with one embodiment of the present invention.

FIG. 3 illustrates a more detailed diagram of the scan flop 200, in accordance with one embodiment of the present invention. In this more detailed illustration, the scan-flop 200 will include a scan multiplexer 202, a clock multiplexer 204, and a D flip-flop 210. As shown, the data terminal D and the scan input terminal SI are both communicated to the scan multiplexer 202. The scan multiplexer 202 is selectively controlled to pass either data or scan data based upon the selection by the scan enable terminal SE. The clock multiplexer 204 is shown receiving the functional clock at the clock terminal C, and the scan clock at the scan clock terminal SC.

In this embodiment, the scan mode terminal SM will be configured to select between the functional clock when SM is set to a logical zero, and provide the scan clock when SM is set to a logical 1. As mentioned above, the implementation of the clock multiplexer 204 in an integrated manner within the scan clock 200, therefore eliminates crossing clock domains and the need to integrate special external logic to generate non-overlapping clocks. This design therefore provides a simple and compact integrated design that will eliminate the problems associated with multiple clock domains and the difficulty of skew management.

Figure 4:
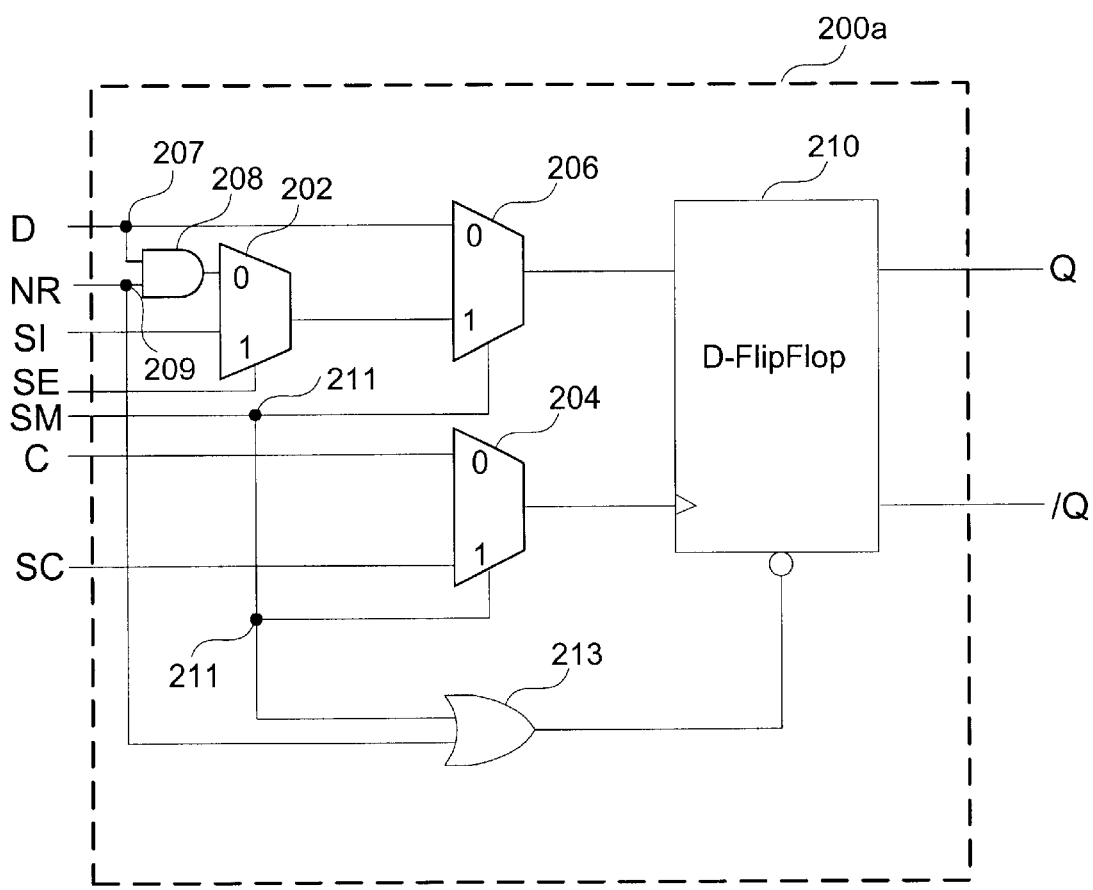
FIG. 4 illustrates an integrated scan-flop that is configured to assist in managing multiple clock domains as in the circuit of FIG. 3 above, and also assist in blocking asynchronous resets during scan mode testing, in accordance with one embodiment of the present invention.

FIG. 4 illustrates an integrated scan-flop 200a that is configured to both assist in managing multiple clock domains as in FIG. 3 above, and also assist in blocking asynchronous resets during scan mode testing, in accordance with one embodiment of the present invention. As shown, the data terminal D is connected to a node 207 that leads to the scan multiplexer 202 as well as an AND gate 208. The AND gate 208 has a second input that is coupled to a node 209. An NR terminal that is external to the scan-flop 200a will couple to node 209, which then leads to the AND gate 208 as well as to an OR gate 213. As used herein, "NR" refers to "Not Reset," thus indicating that the reset function is active low.

The output of the AND gate 208 will lead to a multiplexer 202. The multiplexer 202 will have another input that is coupled to the scan input terminal SI. Thus, the scan enable SE terminal will control the output from the multiplexer 202, which leads to a multiplexer 202. The scan mode SM terminal controls the clock multiplexer 204 via a node 211, as well as the multiplexer 206. Node 211 will also couple to the OR gate 213 which will also be controlled by the scan mode SM terminal. Also shown is the clock multiplexer 204 receiving the functional clock C and the scan clock SC for cases in which there are multiple clock domains. The OR gate 213 will thus output to a reset terminal at the D flip-flop 210. When the scan-flop 200a is functioning in the regular functional mode, the scan mode SM terminal will pass a logical zero which is communicated to the clock multiplexer 204, which in turn passes the functional clock C to the D flip-flop 210. In addition, the logical zero will be passed to the OR gate 213 via node 211 which will therefore not affect the reset of the D flip-flop 210.

On the other hand, when the scan-flop 200a is operating in the scan mode, the scan mode terminal SM will provide a logical one to node 211, which will be communicated to the multiplexer 206, the clock multiplexer 204, and the OR gate 213. At the same time, the scan enable SE terminal will be passing a logical one to the scan multiplexer 202. Because the OR gate 213 is provided with a logical zero via node 211, the asynchronous reset of the D flip-flop will be blocked. Therefore, there will be no inadvertent clearing of data during scan mode operations. In addition, the AND gate 208 will allow the miscellaneous logic that drives the AND gate to be tested if NR is set equal to zero.

If NR is set equal to one, the data provided at the data terminal D will be provided to the D flip-flop 210. It is therefore important to note that during regular functional mode, the reset will be unaffected, but in the scan mode, the asynchronous reset will be internally transformed into a synchronous reset so that no feed through or race condition will occur.

Figure 5:
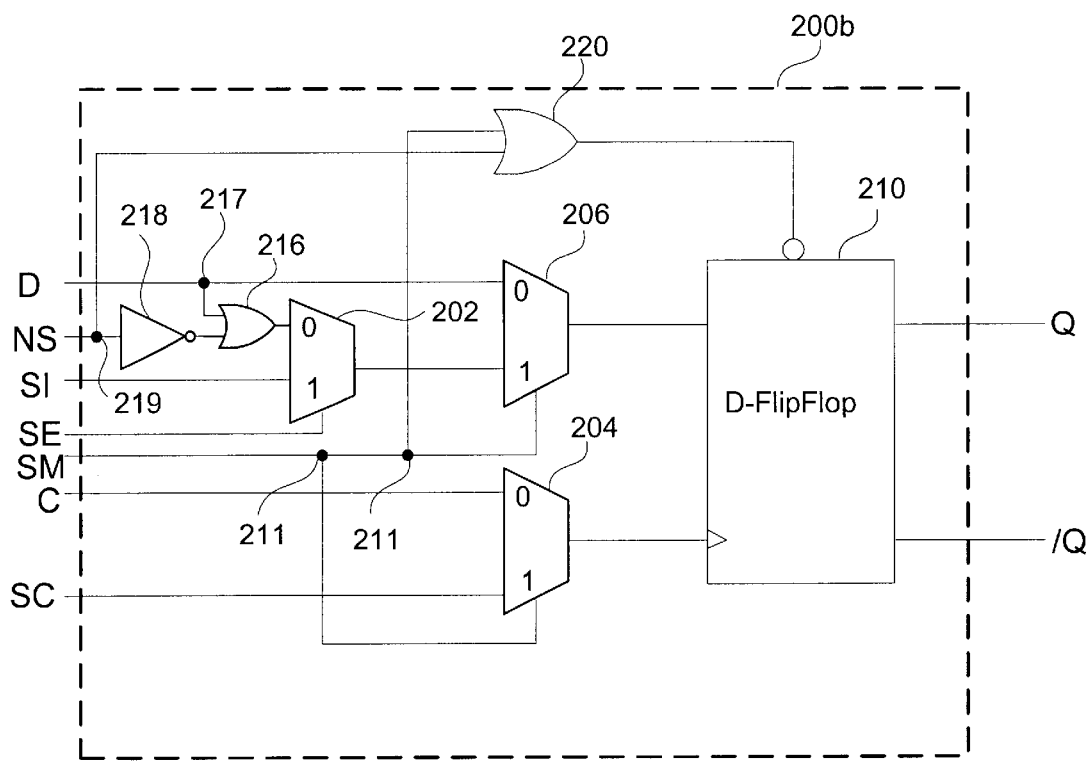
FIG. 5 illustrates a scan-flop circuit with flop set logic, in accordance with one embodiment of the present invention.

FIG. 5 illustrates a scan-flop 200b with flop set, in accordance with one embodiment of the present invention. In this embodiment, the data terminal D is communicated to a node 217 that couples to an OR gate 216 and a multiplexer 206. An NS terminal will couple to a node 219 that is in turn, coupled to an inverter 218 and an OR gate 220. As used herein, "NS" refers to "Not Set," thus indicating that the reset function is active low. The output of the inverter 218 will thus be coupled to an input of the OR gate 216. The OR gate 216 then is coupled to the scan multiplexer 202 that feeds to the multiplexer 206. The scan multiplexer 202 also has the scan input terminal SI communicated thereto, and to the scan enable terminal for controlling the output of the scan multiplexer 202.

The scan mode terminal SM is shown coupled to a node 211 which is coupled to the OR gate 220 as well as the selection terminal of both the multiplexer 206 and the clock multiplexer 204. Also shown is the functional clock C and the scan clock SE being communicated to the clock multiplexer 204. As was the case with the scan-flop 200a, when the circuit is in the functional mode (i.e., SM=0, and SE=0), the set functionality of the D flip-flop 210 will be unaffected. However, when the scan-flop 200b is placed into the scan mode, SM will be set to a logical one, and NS can be set to a logical zero. Because SM is set to logical one, the OR gate 220 will block the asynchronous set during scan mode operation. At the same time, if NS is set to logical zero, the inverter 218 will convert that to a logical one which will be passed through the multiplexer 202, 206, and to the D flip-flop 210. Thus, the scan-flop 200b will be capable of testing the miscellaneous logic that is coupled to the NS terminal and therefore provide a greater fault coverage.

Figure 6:
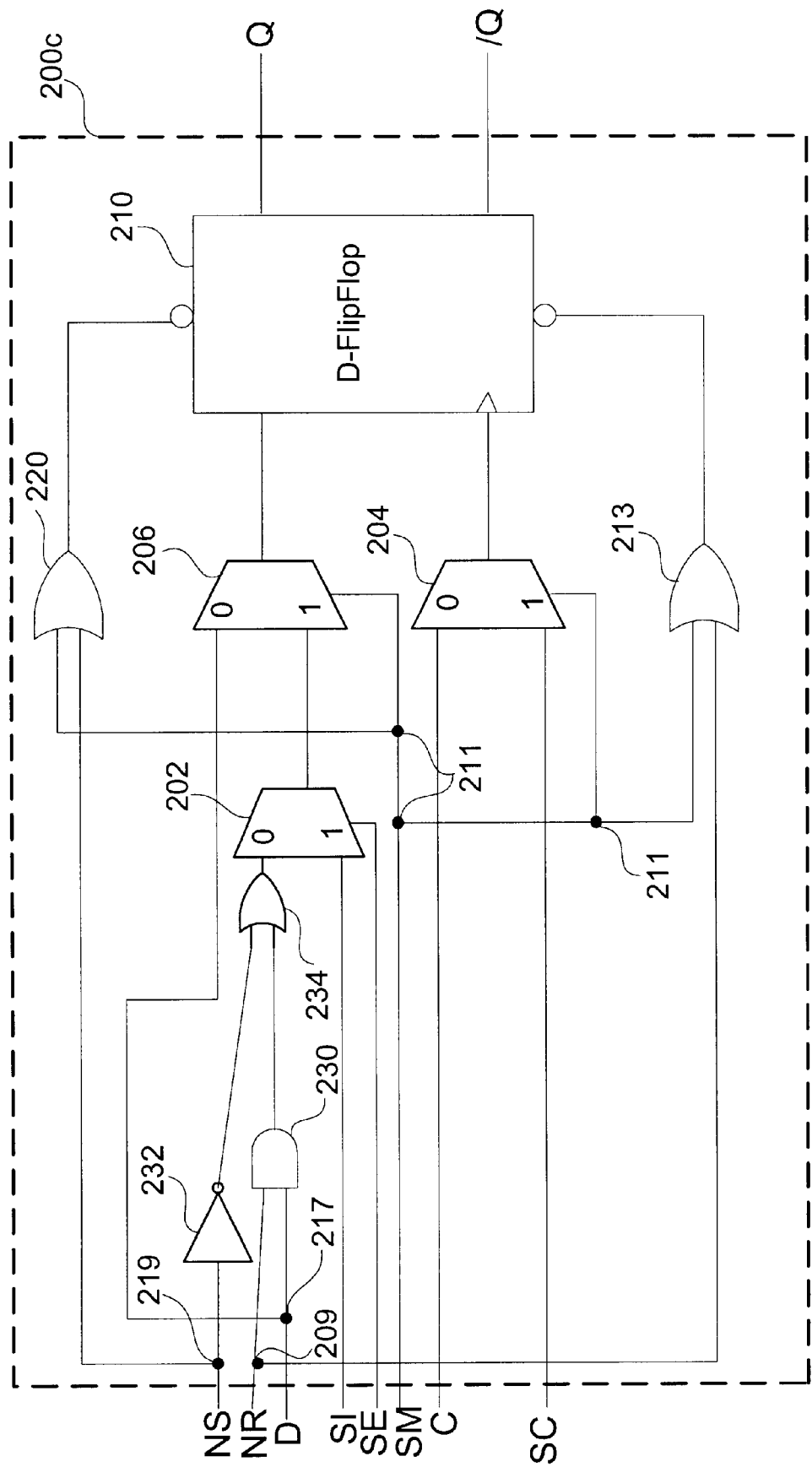
FIG. 6 illustrates an integrated scan-flop having both set and reset capabilities, in accordance with one embodiment of the present invention.

FIG. 6 illustrates an integrated scan-flop 200c having both set and reset capabilities, in accordance with one embodiment of the present invention. In general, there may be cases in which the scan-flop is needed where either set or reset is the dominant condition. Accordingly, the scan-flop 200c should be implemented in cases where "set" is the dominant condition. As shown, the NS terminal is communicated to a node 219 that is coupled to both an inverter 232 and an OR gate 220. The NR terminal is coupled to an AND gate 230 via node 209 which also couples to an OR gate 213. The OR gate 220 couples to the set terminal of the D flip-flop and the OR gate 213 couples to the reset terminal of the D flip-flop 210.

The output of the inverter 232 and the AND gate 230 will couple to an OR gate 234. The OR gate 234 then couples to a scan multiplexer 202 that will receive the scan input SI terminal and the scan enable SE terminal. The output of the scan multiplexer 202 then couples to another multiplexer 206 which also is coupled to the data terminal D by way of a node 217. The scan mode terminal SM is shown coupled to the OR gate 220 as well as the OR gate 213 by way of node 211. Node 211 will also provide the scan mode SM signal to the multiplexer 206 and the clock multiplexer 204. During normal functional mode, the set and reset of the scan-flop 200c will remain unaffected. However, during scan mode, when SM is equal to a logical one, the OR gates 213 and 220 will block both an asynchronous set and an asynchronous reset.

When NS provides a logical zero to node 219, and the logical zero is communicated to inverter 232, the logical zero will be converted to a logical one and provided to the OR gate 234. The logical one may then be communicated through the scan multiplexer 202, the multiplexer 206, and then to the D flip-flop 210 in order to test the miscellaneous logic connected to the NS terminal.

Figure 7:
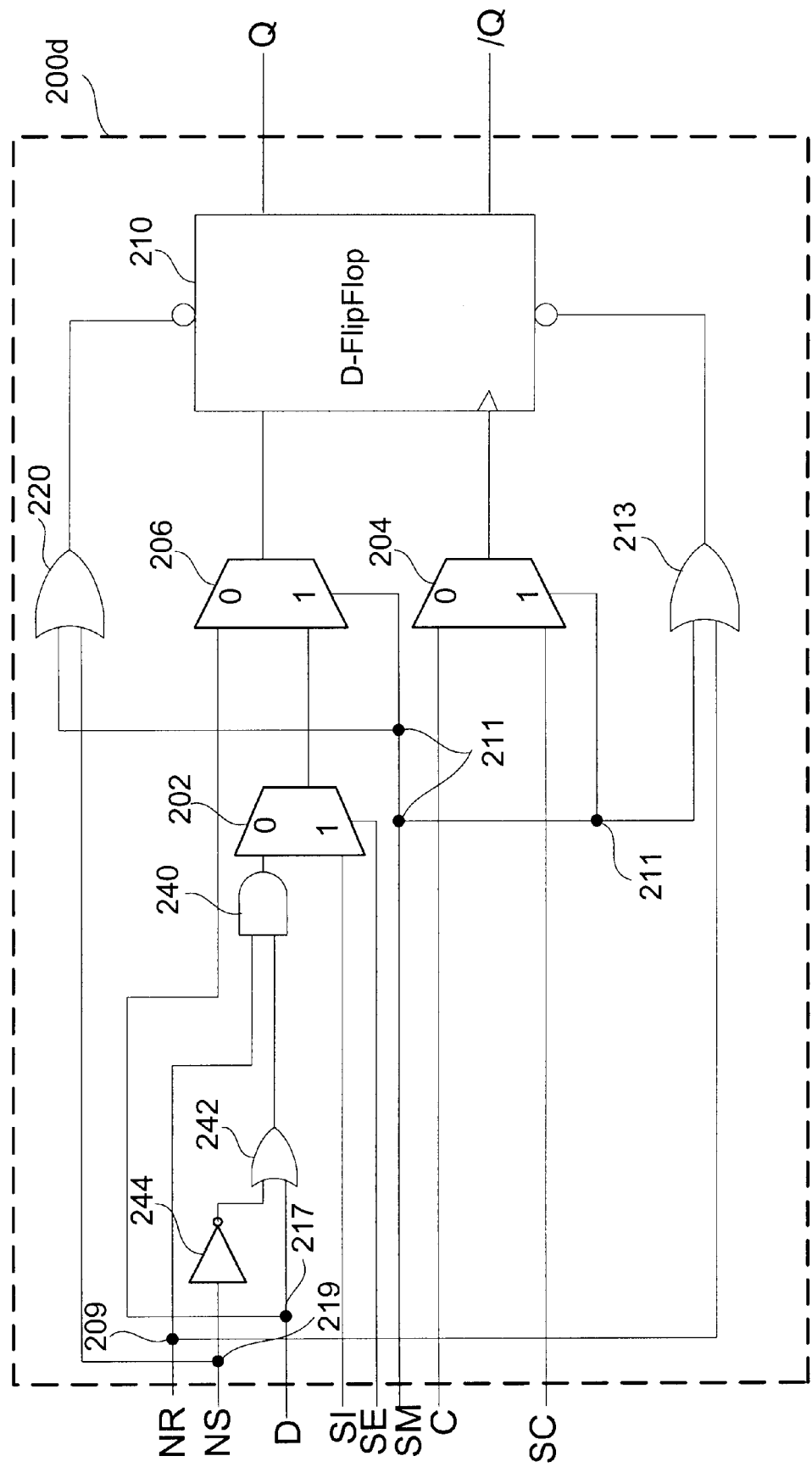
FIG. 7 illustrates an integrated scan-flop that can be used in cases where reset is the dominant condition, in accordance with one embodiment of the present invention.

FIG. 7 illustrates an integrated scan-flop 200d that can be used in cases where reset is the dominant condition, in accordance with one embodiment of the present invention. As shown, the NR terminal couples to a node 209 that is then coupled to an AND gate 240 as well as to an OR gate 213. The NS terminal couples to a node 219 that couples to both an inverter 244 and an OR gate 220. The data terminal D couples to a node 217 that connects to the multiplexer 206 as well as to an OR gate 242, which also receives the output from inverter 244. The output of OR gate 242 then leads to the AND gate 240.

The scan mode SM terminal is shown connected to a node 211 which couples to the OR gate 220 and the OR gate 213. Node 211 also communicates the scan mode SM signal to the select terminal of the multiplexer 206 and the clock multiplexer 204. During the scan mode, when SM is equal to logical one, the OR gates 220 and 213 will disable the asynchronous set and reset to the D flip-flop 210. Also, in this case where reset is dominant, NR set at zero can be communicated to the AND gate 240 and then passed into the D flip-flop 210. Thus, it is possible to test the miscellaneous logic that is connected to the NR terminal.

For more information on scan flop related logic circuitry and functionality, reference may be made to commonly assigned U.S. patent applications having: (1) application Ser. No. 08/951,987, entitled "High Speed Boundary Scan Design," filed on Oct. 16, 1997; (2) application Ser. No. 09/136,071, entitled "Fast Scan-Flop And Integrated Circuit Device Incorporating The Same," filed on Aug. 18, 1998, and (3) application Ser. No. 09/153,634, entitled "Boundary-Scan Cells With Improved Timing Characteristics," filed on Sep. 15, 1998. These applications are hereby incorporated by reference herein.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A scan flop cell, comprising:

a D flip-flop;

a scan multiplexer;

a clock multiplexer, the clock multiplexer being configured to receive a functional clock and a scan clock; and asynchronous reset blocking circuitry, the asynchronous reset blocking circuitry including, a multiplexer being connected to an output of the scan multiplexer and to the data terminal D, the multiplexer having an output that connects to a data node of the D flip-flop;

an AND gate having an input connected to the data terminal D and another input connected to a Not Reset (NR) terminal of the scan flop cell, an output of the AND gate connects to the scan multiplexer; and an OR gate having one input connected to the scan mode terminal and another input connected to the Not Reset (NR) terminal, an output of the OR gate being coupled to a reset terminal of the D flip flop.

2. A scan flop cell as recited in claim 1, wherein the clock multiplexer is controlled by way of a scan mode terminal SM.

3. A scan flop cell as recited in claim 2, wherein the scan flop cell includes, a data terminal D, a scan input terminal SI, a scan enable terminal SE, a functional clock terminal C, a scan clock terminal SC, and the scan mode terminal SM.

4. A scan flop cell, comprising:

a D flip-flop;

a scan multiplexer;

a clock multiplexer, the clock multiplexer being configured to receive a functional clock and a scan clock; and asynchronous set blocking circuitry, the asynchronous set blocking circuitry includes, a multiplexer being connected to an output of the scan multiplexer and to the data terminal D, the multiplexer having an output that connects to a data node of the D flip-flop;

an OR gate having an input connected to the data terminal D and another input connected to an output of an inverter, an input of the inverter being connected to a Not Set (NS) terminal of the scan flop cell, an output of the OR gate connects to the scan multiplexer; and an OR gate having one input connected to the scan mode terminal and another input connected to the Not Set (NS) terminal, an output of the OR gate being coupled to a set terminal of the D flip flop.

5. An integrated scan flop circuit, comprising:

a D flip-flop circuit;

a scan multiplexer;

another multiplexer;

a clock multiplexer;

an asynchronous set blocking OR gate having an output connected to a set terminal of the D flip-flop; and an asynchronous reset blocking OR gate having an output connected to a reset terminal of the D flip flop.

6. An integrated scan flop circuit as recited in claim 5, further comprising:

a Not Set (NS) terminal; and a Not Reset (NR) terminal.

7. An integrated scan flop circuit as recited in claim 6, further comprising:

an AND gate having inputs connected to the Not Reset (NR) terminal and a data terminal D;

an inverter having an input coupled to the Not Set (NS) terminal and an inverter output; and an OR gate having one input coupled to an output of the AND gate, and another input coupled to the inverter output.

8. An integrated scan flop circuit as recited in claim 7, further comprising a scan mode terminal SM that couples to an input of the asynchronous set blocking OR gate, and an input of the asynchronous reset blocking OR gate.

9. An integrated scan flop circuit as recited in claim 8, wherein when a logical one is communicated by the scan mode terminal SM, the asynchronous set blocking OR gate and the asynchronous reset blocking OR gate will block inadvertent sets and resets of the D flip-flop.

10. An integrated scan flop circuit as recited in claim 6, further comprising:

an AND gate connected to the NR terminal, the AND gate having an output that connects to the scan multiplexer;

an inverter having an input coupled to the NS terminal; and an OR gate having one input connected to an output of the inverter and another input coupled to the data terminal D, and the OR gate having an output that connects to the AND gate.

11. An integrated scan flop circuit as recited in claim 10, further comprising a scan mode terminal SM that couples to an input of the asynchronous set blocking OR gate, and an input of the asynchronous reset blocking OR gate.

12. An integrated scan flop circuit as recited in claim 11, wherein when a logical one is communicated by the scan mode terminal SM, the asynchronous set blocking OR gate and the asynchronous reset blocking OR gate will block inadvertent sets and resets of the D flip-flop.

13. A method for making scan flop cell for use in scan testing an integrated circuit design, comprising:

integrating a D flip-flop circuit to the scan flop cell;

integrating a scan multiplexer to the scan flop cell;

integrating a clock multiplexer to the scan flop cell;

integrating another multiplexer to the scan flop cell;

integrating an asynchronous set blocking gate having an output connected to a set terminal of the D flip-flop; and integrating an asynchronous reset blocking gate having an output connected to a reset terminal of the D flip flop;

wherein the asynchronous set and reset blocking gates internally convert set and reset signals into synchronous set and reset signals.

14. A method for making scan flop cell for use in scan testing an integrated circuit design as recited in claim 13, further comprising:

integrating a Not Set (NS) terminal to the scan flop cell; and integrating a Not Reset (NR) terminal to the scan flop cell.

15. A method for making scan flop cell for use in scan testing an integrated circuit design as recited in claim 14, further comprising:

integrating an AND gate to the scan flop cell, the AND gate having inputs connected to the Not Reset (NR) terminal and a data terminal D;

integrating an inverter to the scan flop cell, the inverter having an input coupled to the NS terminal and an inverter output; and integrating an OR gate to the scan flop cell, the OR gate having one input coupled to an output of the AND gate, and another input coupled to the inverter output.

16. A method for making scan flop cell for use in scan testing an integrated circuit design as recited in claim 15, further comprising:

integrating a scan mode terminal SM to the scan flop cell, the scan mode terminal SM is configured to be coupled to an input of the asynchronous set blocking OR gate, and an input of the asynchronous reset blocking OR gate.

17. A method for making scan flop cell for use in scan testing an integrated circuit design as recited in claim 14, further comprising:

integrating an AND gate to the scan flop cell, the AND gate being connected to the NR terminal, the AND gate having an output that connects to the scan multiplexer;

integrating an inverter to the scan flop cell, the inverter having an input coupled to the NS terminal; and integrating an OR gate to the scan flop cell, the OR gate having one input connected to an output of the inverter and another input coupled to the data terminal D, and the OR gate having an output that connects to the AND gate.

18. A method for making scan flop cell for use in scan testing an integrated circuit design as recited in claim 11, further comprising:

integrating a scan mode terminal SM to the scan flop cell, the scan mode terminal SM is configured to be coupled to an input of the asynchronous set blocking OR gate, and an input of the asynchronous reset blocking OR gate.

19. An integrated scan flop circuit, comprising:

a latch circuit;

a scan multiplexer;

another multiplexer;

a clock multiplexer;

an asynchronous set blocking gate having an output connected to a set terminal of the latch circuit;

an asynchronous reset blocking gate having an output connected to a reset terminal of the latch circuit; and a scan mode terminal that couples to an input of the asynchronous set blocking gate, and an input of the asynchronous reset blocking gate;

wherein when a logical one is communicated by the scan mode terminal, the asynchronous set blocking gate and the asynchronous reset blocking gate will block inadvertent sets and resets of the storage circuit.

20. A scan flop cell, comprising:

a latch;

a scan multiplexer;

a clock multiplexer, the clock multiplexer being configured to receive a functional clock and a scan clock; and asynchronous reset blocking circuitry, the asynchronous reset blocking circuitry including, a multiplexer being connected to an output of the scan multiplexer and to the data terminal, the multiplexer having an output that connects to a data node of the latch;

a first gate having an input connected to the data terminal and another input connected to a terminal of the scan flop cell, an output of the first gate connects to the scan multiplexer; and a second gate having one input connected to the scan mode terminal and another input connected to the terminal, an output of the second gate being coupled to a reset terminal of the latch.

21. A scan flop cell, comprising:

a D flip-flop;

a scan multiplexer;

a clock multiplexer, the clock multiplexer being configured to receive a functional clock and a scan clock; and asynchronous set blocking circuitry, the asynchronous set blocking circuitry includes, a multiplexer being connected to an output of the scan multiplexer and to the data terminal D, the multiplexer having an output that connects to a data node of the D flip-flop;

a first gate having an input connected to the data terminal D and another input connected to an output of an inverter, an input of the inverter being connected to a Not Set (NS) terminal of the scan flop cell, an output of the first gate connects to the scan multiplexer; and a second gate having one input connected to the scan mode terminal and another input connected to the Not Set (NS) terminal, an output of the second gate being coupled to a set terminal of the D flip flop.

* * * * *